United States Patent [19]
Gogh

[11] Patent Number: 5,942,042
[45] Date of Patent: Aug. 24, 1999

[54] APPARATUS FOR IMPROVED POWER COUPLING THROUGH A WORKPIECE IN A SEMICONDUCTOR WAFER PROCESSING SYSTEM

[75] Inventor: James Van Gogh, Sunnyvale, Calif.

[73] Assignee: Applied Materials, Inc., Santa Clara, Calif.

[21] Appl. No.: 08/862,272

[22] Filed: May 23, 1997

[51] Int. Cl.[6] .............................. C23C 16/00; H01J 37/32; H01J 37/34; H01L 21/00

[52] U.S. Cl. ................... 118/728; 118/723 I; 118/723 E; 118/723 R; 118/500; 156/345; 204/298.15

[58] Field of Search ............................... 118/723 I, 723 E, 118/723 R, 728, 500; 156/345; 204/298.11, 298.15, 298.23

[56] References Cited

U.S. PATENT DOCUMENTS

| 5,405,480 | 4/1995 | Benzing et al. | 156/345 |
| 5,609,691 | 3/1997 | Shuki | 118/728 |
| 5,630,917 | 5/1997 | Guo | 204/192.12 |
| 5,803,977 | 9/1998 | Tepman et al. | 118/728 |
| 5,863,340 | 1/1999 | Flanigan | 118/728 |

FOREIGN PATENT DOCUMENTS

| 38 35 153 | 4/1990 | Germany . |
| 9-035894 | 2/1997 | Japan . |
| 9-036088 | 2/1997 | Japan . |

*Primary Examiner*—Bruce Breneman
*Assistant Examiner*—Jeffrie R Lund
*Attorney, Agent, or Firm*—Thomason & Moser

[57] ABSTRACT

Apparatus for supporting a wafer in a semiconductor wafer processing system. The apparatus contains a pedestal assembly, a ring assembly circumscribing the pedestal and an insulator between the pedestal assembly and ring assembly. The insulator electrically isolates the pedestal assembly from the ring assembly thereby preventing unwanted power coupling through the ring assembly.

15 Claims, 3 Drawing Sheets

APPARATUS FOR IMPROVED POWER COUPLING THROUGH A WORKPIECE IN A SEMICONDUCTOR WAFER PROCESSING SYSTEM

BACKGROUND OF THE INVENTION

1. Field of the Invention

The invention relates generally to plasma-enhanced processing of semiconductor wafers and, more specifically, to an apparatus for improving voltage stability on a workpiece and electrical coupling between a plasma and the workpiece in a semiconductor wafer processing system.

2. Description of the Background Art

Plasma-enhanced reactions and processes have become increasingly important to the semiconductor industry, providing for precisely controlled thin-film depositions. For example, a plasma reactor in a high-temperature physical vapor deposition (PVD) semiconductor wafer processing system generally comprises a reaction chamber for containing a reactant gas, a pair of spaced-apart electrodes (cathode and anode) that are driven by a high power DC voltage to generate an electric field within the chamber, and a substrate support for supporting a substrate within the chamber. The cathode is typically a target material that is to be sputtered or deposited onto the substrate, while the anode is typically a grounded chamber component. The electric field, creating a reaction zone, capture electrons thereby ionizing the reactant gas into a plasma. The plasma, characterized by a visible glow, is a mixture of positive and negative reactant gas ions and electrons. Ions from the plasma bombard the negatively biased target releasing electrically neutral deposition material. As such, a conductive deposition film forms on the substrate which is supported and retained upon the surface of the pedestal. Additionally, a deposition ring assembly circumscribes the pedestal. This ring assembly contains a number of concentric rings that assist with wafer process functions. For example, a shadow ring and cover ring prevent deposition material from being deposited on surfaces other than the substrate.

To further enhance deposition in an ion metallization system, a specific type of PVD system, the substrate and pedestal are biased negatively with respect to the plasma. This is accomplished by providing RF power to the pedestal. A negative DC offset accumulates on the pedestal as a result of the higher velocity of electrons as compared to the positive ions in the plasma. In some processes, as neutral target material is sputtered off the target and enters the plasma, the target material becomes positively ionized. With the negative DC offset at the pedestal, the positively ionized target material is attracted to and deposits on the substrate more readily than on an unbiased pedestal. Ordinarily, a 400 KHz AC source is used to bias the pedestal, but other frequency sources such as a 13.56 MHz source may also be used.

Ideally, the voltage magnitude at the substrate (i.e., a semiconductor wafer) remains stable during processing and is reproducible from wafer-to-wafer over an entire processing cycle. That is, the voltage level at the wafer remains constant as the target material is being deposited onto the wafer. A stable voltage level at the wafer causes the ionized deposition material to be drawn uniformly to the wafer. A uniform deposition film layer is a highly desirable characteristic in the semiconductor wafer manufacturing industry. Additionally, the same stable voltage magnitude must reproduce or occur as each new wafer is processed. Reproducing the same stable voltage magnitude for each new wafer is also desirable as it reduces the amount of improperly processed wafers and improves the accuracy of the film deposition amongst a batch of wafers. As such, overall quality of manufactured product increases.

The characteristics of voltage stability and reproducibility are optimized when the wafer is the only electrical conductor in direct contact with the plasma. That is, voltage stability and reproducibility is maintained when the wafer forms the path of least resistance for power coupling. Existing pedestal configurations allow for various electrical paths wherein voltage stability is compromised. One such electrical path establishes through one of the aforementioned rings in the process chamber. The rings are made of conductive material (e.g., stainless steel) which have instantaneous impedance values that are lower than the impedance of the pedestal/wafer combination. As such, the high voltage conducts to the plasma through one or more of the rings in lieu of, or in addition to, a path through the wafer. When a ring becomes the momentary path of least resistance, voltage instability occurs at the wafer. The resultant instability of the wafer voltage causes the aforementioned nonuniformity of film deposition on the wafer.

Voltage stability is also compromised when the DC bias level on the wafer is different from that of another local conductor (i.e., a deposition ring assembly). When the potential difference between two conductors in the process chamber becomes too large, arcing can occur. Arcing is deleterious because a large enough discharge creates particles in the chamber that may be deposited on the wafer. Arcing is undesirable because it also creates another temporary conductive path that shifts the plasma away from the wafer and damages the wafer surface.

Consequently, there is a need to electrically isolate the conductive path from the pedestal to the plasma, via the wafer. Electrical isolation stabilizes wafer voltage thereby improving the deposition process.

Therefore, there is a need in the art for an apparatus that optimally conducts power from a pedestal through the wafer and plasma to optimize wafer voltage stability and reproducibility.

SUMMARY OF THE INVENTION

The disadvantages heretofore associated with the prior art are overcome by an apparatus for optimally coupling power through a wafer in a semiconductor wafer processing system. The inventive apparatus has a pedestal assembly, a deposition ring assembly circumscribing the pedestal assembly and an annular insulator located between the pedestal assembly and the deposition ring assembly. The annular insulator electrically isolates the pedestal assembly from the deposition ring assembly. An inner surface of the annular insulator contacts and supports the pedestal assembly and a portion of the outer surface of the annular insulator contacts the deposition ring assembly. As such, the pedestal and rings are not in conductive contact. To prevent arcing across the insulator, the apparatus contains an electrical connection (e.g., an inductor) between the pedestal assembly and the deposition ring assembly to create a high impedance pathway that provides conduction of DC power.

In sum, the insulator defines a conductive pathway for power coupling during wafer processing. Specifically, power coupling occurs only through the wafer and not through neighboring conductors. As such, voltage stability and reproducability at the wafer is maintained which improves ion deposition from the plasma. The additional electrical connection between the pedestal and the deposition ring assembly (e.g., the inductor) provides a pathway for DC power only. As such, RF energy does not readily conduct through the deposition ring assembly. Further, the pedestal and deposition ring assembly remain at the same DC potential which reduces the possibility of arcing.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
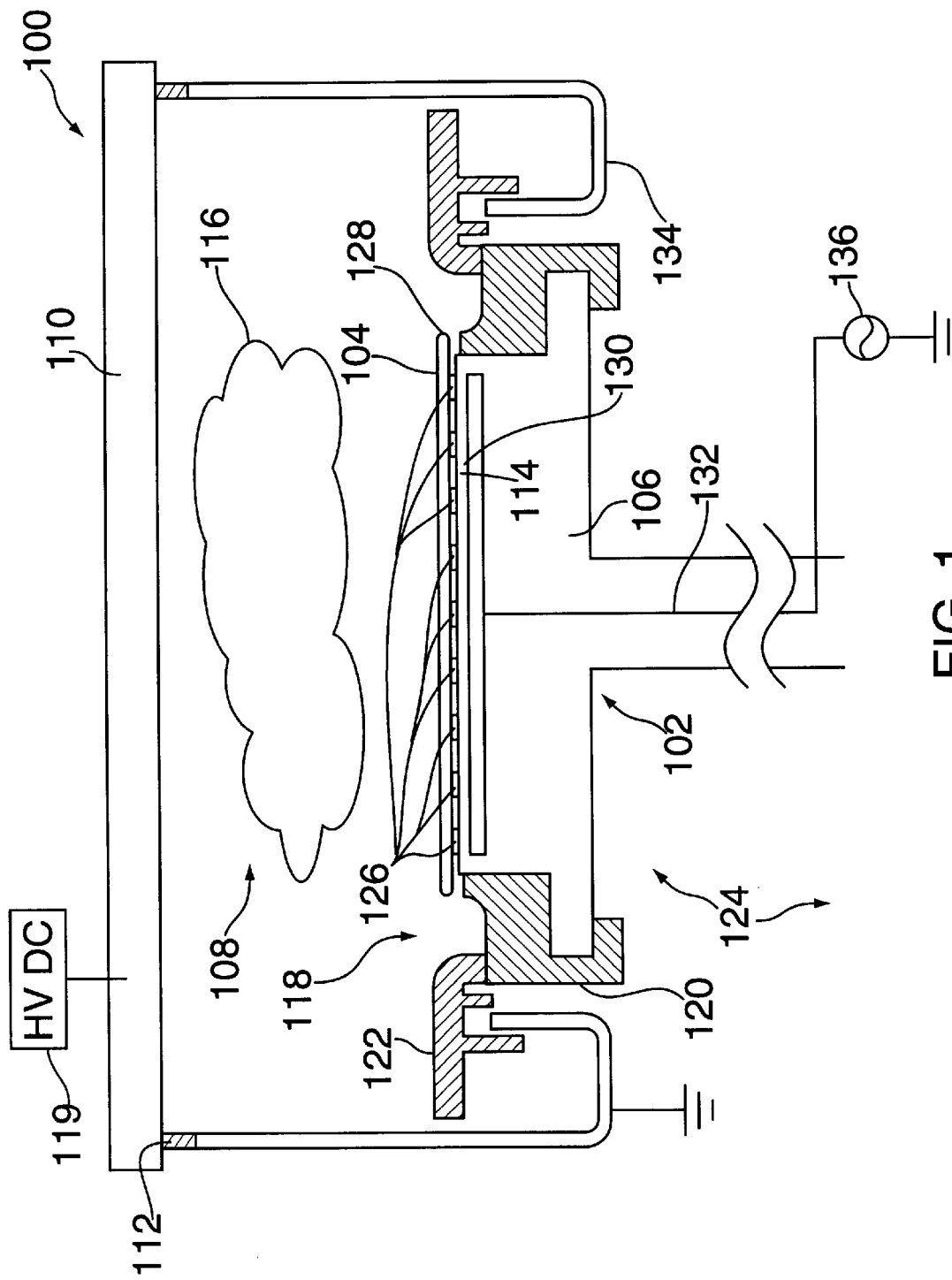
FIG. 1 is a cross-sectional view of a prior art pedestal in a wafer processing chamber.

FIG. 1 depicts a cross-sectional, simplified view of the middle of a conventional PVD wafer processing chamber 100. The chamber 100 contains a conventional pedestal assembly 102 used to support and retain a wafer 104 in the chamber 100. The pedestal assembly 102 comprises a pedestal 106 having a surface 114 that supports the wafer 104. Specifically, the wafer is supported on a disc-like surface having an array of buttons 126 upon which the wafer 104 rests. A chamber lid 110 at the top of the chamber 100 contains deposition target material (e.g., titanium) and is electrically connected to a high power negative DC source 119 to form a cathode. The chamber lid 110 is electrically isolated from the remainder of the chamber 100. Specifically, insulator ring 112, electrically isolates the chamber lid 110 from a grounded annular shield member 134 which forms an anode. An electric field is induced in a reaction zone 108 between the cathode chamber lid 110 and anode shield member 134 when the high power DC source 119 is switched on. A process gas is provided to the reaction zone 108 via a process gas supply (not shown). The electric field created by the high power DC source 119 ionizes the process gas and creates a uniform, high-density, low electron temperature plasma 116. As such, DC current follows an electrically conductive path from the cathode chamber lid 110, through the plasma 116, to the anode shield member 134.

Additionally, an electrode 130, acts as an additional cathode for conducting additional electrical power during wafer processing. Ideally, the entire pedestal assembly 102 functions as a cathode. Alternately, the electrode can be a conducting material embedded in a dielectric material of the pedestal 106, (e.g., a thin copper layer sealed in polyimide and adhered to the surface 114 of the pedestal 106) or the pedestal is fabricated of a dielectric material (a ceramic) having an embedded electrode. The electrode 130 (or pedestal 102 itself) is electrically connected via connector 132 to an RF power source 136. The RF power source 136 provides electrical power necessary to bias the wafer to improve film deposition. That is, a negative DC bias forms on the wafer as discussed previously. This DC bias has a local effect of attracting sputtered ions of target material which deposit on the wafer.

The chamber 100 also has a ring assembly 118 to prevent sputtered ions from depositing on chamber components (e.g., the pedestal 106) inadvertently. Specifically, one or more rings circumscribe the pedestal assembly 102. For example, a shadow ring 120 abuts the pedestal 106 and radially extends therefrom. The shadow ring 120 captures stray target material that would otherwise be improperly deposited on the pedestal 106. A cover ring 122 slightly overlaps and radially extends from the shadow ring 120. The cover ring 122 prevents deposition on the lower region and surfaces 124 of the chamber 100. Additionally, annular shield member 134 is suspended from the chamber lid 110 and defines the lateral extremities of the reaction zone 108.

The rings are fabricated of conductive material (e.g., stainless steel) that provide an alternate electrically conductive path for the RF power from power source 136 to couple to the plasma 116. As a wafer 104 is placed on the pedestal 106, an outer edge 128 of the wafer 104 overhangs the shadow ring 120. If the lowest impedance path is not through the wafer 104, the RF power couples to the plasma via another path. As such, the voltage or the wafer 104 becomes unstable and nonreproduceable. Sputtered ions in the plasma are directed away from the wafer thereby creating nonuniform film deposition on the wafer.

Figure 2:
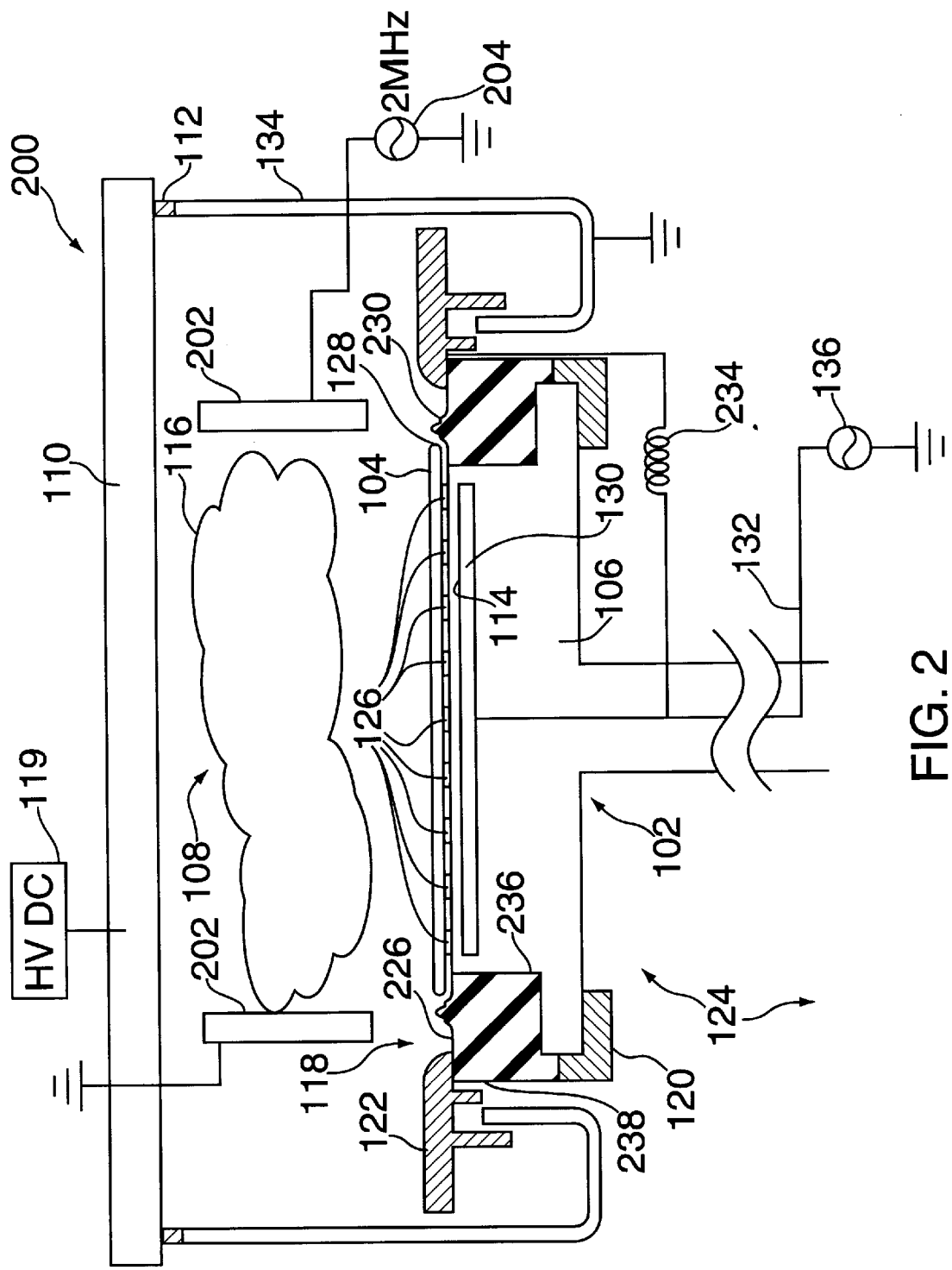
FIG. 2 is a cross-sectional view of inventive apparatus.

The inventive apparatus is shown in FIG. 2. A high-density plasma-enhanced reaction chamber 200 is depicted having all of the elements described in the prior art chamber 100 for processing semiconductor wafers.

As previously discussed a plasma is created by ionization of a process gas in the reaction zone 108. To facilitate such ionization, an ionization enhancing circuit is provided in the reaction zone 108. Specifically, a single turn coil 202 encircles the reaction zone. The single turn coil 202 is connected to a high frequency (preferably 2 MHz) power source 204. This additional power source induces the plasma 116 to a higher level of ionization that is extremely desirable during the deposition process. Although a single turn coil is discussed, a variety of elements can be used to achieve the higher level of ionization including, but not limited to a multiple turn coil.

An annular insulator 226 is provided at the periphery of the pedestal assembly 102 to electrically isolate an optimal electrical pathway (i.e., the conductive path comprising the cathode pedestal assembly, wafer, plasma and anode shield member) from other potentially lower impedance pathways. Specifically, an inner surface 236 of an annular ring of insulating material contacts the pedestal 106. A portion of an outer surface 238 of the annular ring contacts and supports the cover ring 122. A top surface 230 of the insulator 226 is contoured to prevent stray deposition from forming a conductive film across the top surface of the insulator 226. As discussed above, the wafer 104 rests only on the array of buttons 126. The wafer does not contact the top surface 230 of the insulator 226. The shadow ring 120, contacts the pedestal 106, is positioned below the insulator 226 and is electrically isolated from the cover ring 122. With the insulator 226 disposed between the pedestal 106 and cover ring 122 (or any similar conductor adjacent the pedestal), RF power does not have a conductive path through the ring assembly 118 to the anode shield member 134. The insulating material is any material suitable for preventing conduction of electrical charges or capacitive coupling and is preferably quartz or alumina. Additionally, the insulator is a separate component which is fitted onto the pedestal 106 before beginning the deposition process. Although the component is used in a high-density plasma deposition process, it can be used in any type of process where undesirable electrical pathways need to be eliminated.

Figure 3:
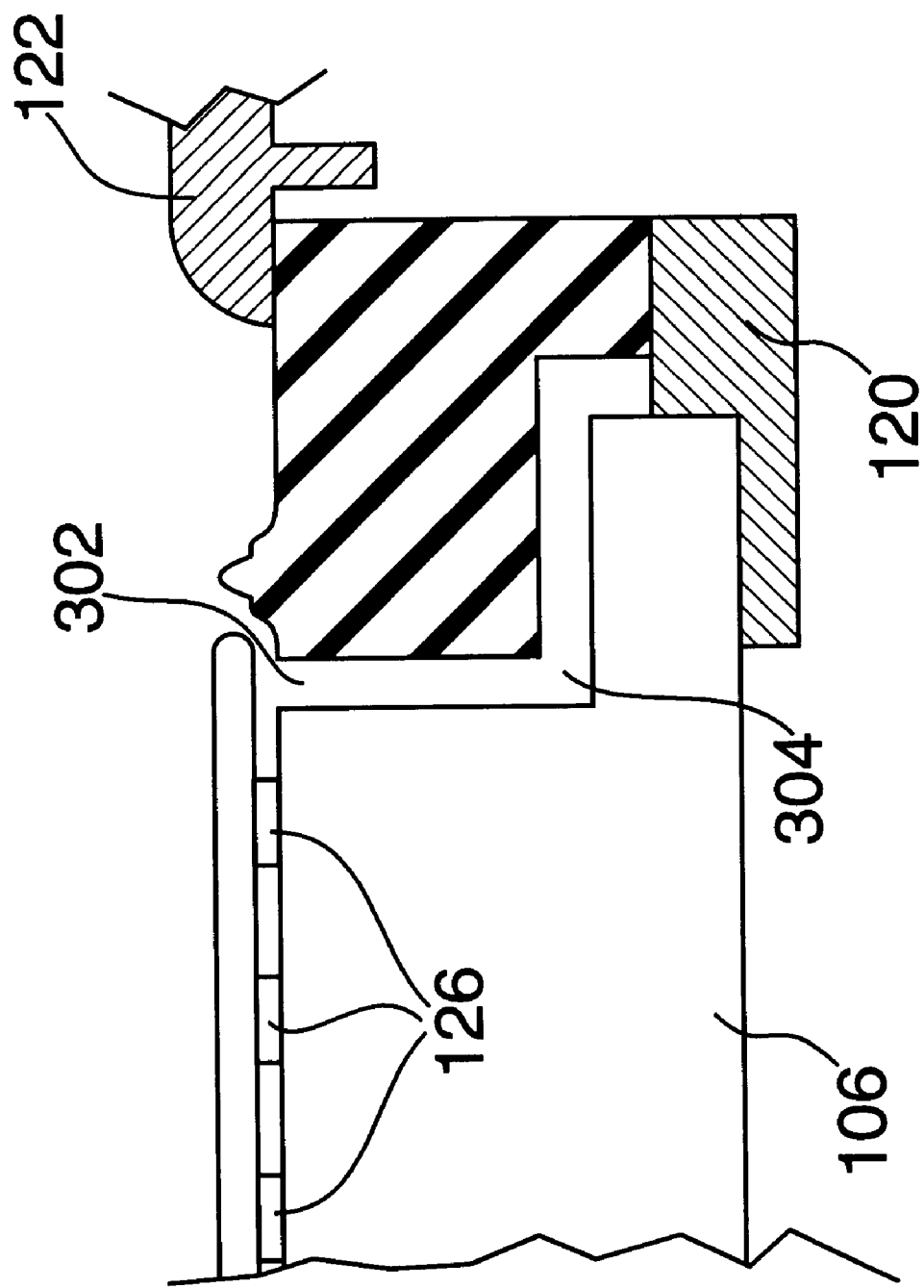
FIG. 3 is a detailed cross-sectional view of an alternate embodiment of the inventive apparatus.

Although the insulator shown in FIG. 2 and discussed above has a contoured top surface 230 and is generally a stepped, annular ring, the insulator can be any shape or configuration that eliminates power coupling through alternate electrical pathways. For example, the insulator can form a complex surface. In FIG. 3, a close-up view of a preferred configuration is shown. The labyrinth-like top surface configuration reduces the likelihood of a conductive pathway being created by inadvertent film deposition across the surface of the insulator ring. Specifically, a notched opening 302 and corresponding channel 304 between the insulator and the pedestal assembly form a complex surface that does not promote film growth. The film forms only on small sections that do not establish a continuous conductive path from beneath the wafer to the rings 120 and 122.

Returning to FIG. 2, the apparatus is also provided with a circuit element to limit RF power coupling through the deposition ring assembly 118. Specifically, an inductor 234 is electrically connected between electrode 130 (or pedestal 106) and the cover ring 122. The inductor 234 provides a high impedance pathway from the RF power source 136 to the deposition ring assembly 118. As such, RF power does not readily conduct in this pathway. The known steady-state characteristics of the inductor 234 dictate that the deposition ring assembly 118 and pedestal 106 "float" to the same DC potential. Since the wafer and pedestal 106 are capacitively coupled, there is a negligibly small potential drop between them. When the wafer and deposition ring assembly are at nearly the same DC potential, arcing is not likely to occur.

Thus, the subject invention solves the problem of inconsistent and non-uniform voltage levels coupling at the wafer and the resultant nonuniform deposition film growth. The optimal pathway to couple RF power to a plasma is electrically isolated and well defined by the invention. Additionally, a high impedance pathway is established between the wafer and alternate pathways (i.e., the deposition ring assembly). This prevents RF power coupling and equalizes DC bias levels on neighboring surfaces. Since the potential difference between neighboring surfaces (i.e., the wafer and deposition rings) is negligible, power coupling through arcing is eliminated.

Although various embodiments which incorporate the teachings of the present invention have been shown and described in detail herein, those skilled in the art can readily devise many other varied embodiments that still incorporate these teachings.

What is claimed is:

1. Apparatus for supporting a wafer in a semiconductor wafer processing system comprising:

a pedestal assembly;

a deposition ring assembly circumscribing the pedestal assembly; and an insulator disposed between the pedestal assembly and the deposition ring assembly for electrically isolating the pedestal assembly from the deposition ring assembly.

2. The apparatus of claim 1 wherein the insulator is an annular ring having an inner surface and an outer surface, where the inner surface of the insulator contacts the pedestal assembly and a portion of the outer surface of the insulator contacts the deposition ring assembly.

3. The apparatus of claim 1 wherein the insulator further comprises a top surface that is contoured.

4. The apparatus of claim 3 wherein the insulator is quartz.

5. The apparatus of claim 3 wherein the insulator is alumina.

6. The apparatus of claim 3 wherein the insulator comprises a complex surface.

7. The apparatus of claim 6 wherein the insulator further comprises a notched opening and corresponding channel thereby forming a labyrinth between the insulator and pedestal assembly.

8. The apparatus of claim 1 further comprising an electrical circuit element between the pedestal assembly and deposition ring assembly to create a high impedance, DC leveling pathway.

9. The apparatus of claim 8 wherein the electrical circuit element is an inductor.

10. Apparatus for supporting a wafer in a semiconductor wafer processing system comprising:

a pedestal having a surface for supporting a semiconductor wafer;

a cover ring circumscribing the pedestal, an insulating ring disposed between and contacting a peripheral edge of the pedestal and the cover ring, having a top surface that is contoured; and an inductor electrically connected between the electrode and the cover ring.

11. The apparatus of claim 10 wherein the insulating ring is quartz.

12. The apparatus of claim 10 wherein the insulating ring is alumina.

13. The apparatus of claim 10 wherein the insulating ring comprises a complex surface.

14. The apparatus of claim 13 wherein the insulating ring further comprises a notched opening and corresponding channel thereby forming a labyrinth between the insulating ring and the pedestal.

15. Apparatus for supporting a wafer in a semiconductor wafer processing system comprising:

a vacuum chamber for establishing a semiconductor wafer processing environment, a pedestal having a surface for supporting a semiconductor wafer and a cathode electrode for biasing the semiconductor wafer, a target having deposition material and an anode electrode, a ring assembly circumscribing the pedestal, an insulator disposed between a peripheral edge of the pedestal and the ring assembly, for isolating an electrically conductive pathway from the cathode electrode to the anode electrode, and an inductor electrically connected between the pedestal and the ring assembly for maintaining a DC potential between the pedestal and ring assembly without compromising the electrically conductive pathway.

* * * * *

UNITED STATES PATENT AND TRADEMARK OFFICE
CERTIFICATE OF CORRECTION

PATENT NO.   : 5,942,042                              Page 1 of 1
DATED        : August 24, 1999
INVENTOR(S)  : James Van Gogh It is certified that error appears in the above-identified patent and that said Letters Patent is hereby corrected as shown below:

Column 5,
Lines 53, and 54 delete "for electrically isolating the pedestal assembly from the deposition ring assembly"

Column 6,
Line 21, after "a pedestal having a", insert -- wafer support --;
Line 21, after "surface" insert -- and an electrode --;
Lines 21, and 22 delete "for supporting a semiconductor wafer";
Lines 43, and 44, delete "for establishing a semiconductor wafer processing environement";
Line 44, after "a pedestal having a" insert -- wafer support --;
Line 44 delete "for supporting a semiconductor wafer";
Lines 45, and 46, delete "for biasing the semiconductor wafer";
Lines 53, and 54, delete "for isolating an electrically conductive pathway from the cathode eletrode to the anode electrode";
Lines 55 thru 58 delete "for maintaing a DC potential between the pedestal and ring assembly withoutcomprising the electrically conductive pathway".

Signed and Sealed this

Fourteenth Day of August, 2001

*Attest:*

*Attesting Officer*

NICHOLAS P. GODICI
*Acting Director of the United States Patent and Trademark Office*